United States Patent
Kim et al.

(10) Patent No.: US 11,695,172 B2
(45) Date of Patent: Jul. 4, 2023

(54) HEAT DISSIPATING STRUCTURE OF CYLINDRICAL BATTERY CELL

(71) Applicant: LG CHEM, LTD., Seoul (KR)

(72) Inventors: Jae Sang Kim, Suwon-si (KR); Kun Joo Yang, Cheongju-si (KR); Seog Jin Yoon, Cheongju-si (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 666 days.

(21) Appl. No.: 16/466,526

(22) PCT Filed: Feb. 8, 2018

(86) PCT No.: PCT/KR2018/001705
§ 371 (c)(1),
(2) Date: Jun. 4, 2019

(87) PCT Pub. No.: WO2018/186579
PCT Pub. Date: Oct. 11, 2018

(65) Prior Publication Data
US 2020/0067154 A1    Feb. 27, 2020

(30) Foreign Application Priority Data

Apr. 3, 2017    (KR) .................... 10-2017-0043028

(51) Int. Cl.
*H01M 10/6551*    (2014.01)
*H01M 10/643*    (2014.01)
(Continued)

(52) U.S. Cl.
CPC ...... *H01M 10/6551* (2015.04); *G01R 31/382* (2019.01); *G01R 31/396* (2019.01);
(Continued)

(58) Field of Classification Search
CPC .......... H01M 10/6551; H01M 10/643; H01M 10/653; H01M 10/6554; H01M 10/44;
(Continued)

(56) References Cited

U.S. PATENT DOCUMENTS

| 2003/0054230 A1 | 3/2003 | Al-Hallaj et al. |
| 2007/0020513 A1* | 1/2007 | Medina ................. H01G 11/82 |
| | | 429/120 |

(Continued)

FOREIGN PATENT DOCUMENTS

| CN | 105977423 | * | 9/2016 | ............. H01M 2/10 |
| DE | 10 2008 034 695 A1 | | 1/2010 | |

(Continued)

OTHER PUBLICATIONS

Machine English translation CN 105977423 (Year: 2016).*
(Continued)

*Primary Examiner* — Michael L Dignan
(74) *Attorney, Agent, or Firm* — Birch, Stewart, Kolasch & Birch, LLP

(57) ABSTRACT

A heat-radiating structure of a cylindrical battery cell includes a first plate configured to contact an upper partial area of a battery cell and to which a current of the battery cell is discharged, the first plate having an area not contacting the battery cell, a second plate disposed between the first plate and the battery cell, the second plate not contacting the battery cell, and a heat transfer part disposed between the second plate and the battery cell and configured to transfer heat generated in the battery cell to the second plate while contacting the battery cell is provided. The second plate contacts the area of the first plate not contacting the battery cell and a portion of the current discharged from the battery
(Continued)

cell to the first plate is discharged from the second plate. A heat-radiating system of a cylindrical battery is also provided.

16 Claims, 2 Drawing Sheets

(51) Int. Cl.
    *H01M 10/653*     (2014.01)
    *H01M 10/6554*     (2014.01)
    *G01R 31/396*     (2019.01)
    *G01R 31/382*     (2019.01)
    *H01M 10/44*     (2006.01)
    *H01M 50/569*     (2021.01)

(52) U.S. Cl.
    CPC ......... *H01M 10/44* (2013.01); *H01M 10/643* (2015.04); *H01M 10/653* (2015.04); *H01M 10/6554* (2015.04); *H01M 50/569* (2021.01)

(58) Field of Classification Search
    CPC ......... H01M 2220/20; H01M 2220/30; H01M 10/6235; H01M 10/625; H01M 50/569; H01M 10/613; H01M 10/0525; G01R 31/382; G01R 31/396; G01R 31/36
    USPC .......................................................... 429/62
    See application file for complete search history.

(56) References Cited

U.S. PATENT DOCUMENTS

| | | | |
|---|---|---|---|
| 2007/0275298 A1 | 11/2007 | Igoris et al. | |
| 2009/0068555 A1 | 3/2009 | Fukuoka et al. | |
| 2009/0220825 A1 | 9/2009 | Nakashima et al. | |
| 2011/0171515 A1* | 7/2011 | Itoi | H01M 50/503 429/158 |
| 2011/0293986 A1 | 12/2011 | Kozu | |
| 2012/0034499 A1 | 2/2012 | Meehan | |
| 2012/0208063 A1* | 8/2012 | Zhou | H01M 10/613 429/120 |
| 2016/0226107 A1* | 8/2016 | Worry | H01M 10/4207 |
| 2017/0194610 A1* | 7/2017 | Tschiggfrei | H01M 50/572 |
| 2019/0044194 A1* | 2/2019 | Hong | H02J 7/0019 |

FOREIGN PATENT DOCUMENTS

| | | | | |
|---|---|---|---|---|
| DE | 102008034695 A1 * | 1/2010 | ............ | H01M 50/20 |
| JP | 2007-236033 A | 9/2007 | | |
| JP | 2009-538505 A | 11/2009 | | |
| JP | 2011-113845 A | 6/2011 | | |
| JP | 2015-162318 A | 9/2015 | | |
| JP | 6103136 B2 | 3/2017 | | |
| KR | 10-2002-0093827 A | 12/2002 | | |
| KR | 10-2006-0097325 A | 9/2006 | | |
| KR | 10-0667943 B1 | 1/2007 | | |
| KR | 10-2011-0084959 A | 7/2011 | | |
| KR | 10-2014-0142770 A | 12/2014 | | |
| KR | 10-1603626 B1 | 3/2016 | | |
| KR | 20180044483 A * | 5/2018 | ............ | H01M 10/44 |
| WO | WO 2015/169820 A1 | 11/2015 | | |

OTHER PUBLICATIONS

International Search Report (PCT/ISA/210) issued in PCT/KR2018/001705, dated May 14, 2018.

European Search Report for Application No. 18781246.6 dated Jan. 21, 2020.

* cited by examiner

HEAT DISSIPATING STRUCTURE OF CYLINDRICAL BATTERY CELL

TECHNICAL FIELD

The present disclosure relates to a heat-radiating structure of a cylindrical battery cell, and more particularly, to a heat-radiating structure of a cylindrical battery cell, which is for reducing heat generated when a battery cell is discharged.

BACKGROUND ART

Lithium ion batteries are classified into a cylindrical shape, a square shape, and a polygonal shape according to shapes thereof. Here, the cylindrical shaped battery, which has a cylindrical shape, has high capacity and power. Accordingly, the cylindrical shaped battery is generally used for a product and a field, which consume high electric power. For example, the cylindrical shaped battery may be applied to electric tools, electric vehicles, and electric bicycles, which require a high momentary force.

In general, the cylindrical shaped battery includes a plurality of cylindrical battery cells. The cylindrical shaped battery is manufactured through a process of electrically connecting the plurality of batteries to each other. The process of electrically connecting the plurality of battery cells as described above is generally performed through a method for resistance-welding an upper portion of the cell to a nickel plate. That is, the battery cells are electrically connected to each other in such a manner that one portion of the nickel plate having a strip shape is connected to the upper portion of the battery cell, and the opposite portion of the nickel plate is welding-connected to a nickel plate connected to another battery cell.

However, when the above-described method is used, since the portion in which the upper portion of the battery cell is connected to the nickel plate is a partial portion, a structure having a contact area through which a current flows from the battery cell to the nickel plate is partially formed is provided. Here, the nickel plate has a limitation in electrical conductivity due to material characteristics thereof.

Accordingly, when the battery cell is discharged with a high current in the above-described structure, since the high current flows to the nickel plate, a large amount of heat is generated in the nickel plate and the battery cell due to the limitation in the area through which a current flows and the electrical conductivity of the nickel plate.

DISCLOSURE OF THE INVENTION

Technical Problem

The present disclosure provides a cylindrical battery having the above-described structure to solve a limitation of heat generation in a battery cell and a nickel plate when the battery cell is discharged with a high current.

Technical Solution

In accordance with an exemplary embodiment, a heat-radiating structure of a cylindrical battery cell includes: a first plate configured to contact an upper partial area of a battery cell and to which a current of the battery cell is discharged, the first plate having an area not contacting the battery cell; a second plate disposed between the first plate and the battery cell, the second plate not contacting the battery cell; and a heat transfer part disposed between the second plate and the battery cell and configured to transfer heat generated in the battery cell to the second plate while contacting the battery cell. The second plate contacts the area of the first plate not contacting the battery cell and a portion of the current discharged from the battery cell to the first plate is discharged from the second plate.

In an exemplary embodiment, the second plate may be made of a material having a higher electrical conductivity than that of the first plate.

In an exemplary embodiment, the first plate may be made of nickel, and the second plate may be made of copper.

In an exemplary embodiment, the heat transfer part may be made of a thermal interface material (TIM).

In accordance with another exemplary embodiment, a heat-radiating system of a cylindrical battery cell includes: a current measuring part configured to measure a current of a battery cell; a control part configured to control the current of the battery cell to be discharged, when the current of the battery cell measured by the current measuring part is equal to or greater than a predetermined value; a first plate configured to contact an upper partial area of the battery cell and to which the current of the battery cell is discharged according to control of the control part, the first plate having an area not contacting the battery cell; a second plate disposed between the battery cell and the first plate, the second plate not contacting the battery cell, and the second plate configured to contact the area of the first plate not contacting the battery cell so that a portion of the current discharged from the battery cell to the first plate is discharged from the second plate; and a heat transfer part disposed between the second plate and the battery cell and configured to transfer heat generated in the battery cell to the second plate while contacting the battery cell.

In an exemplary embodiment, the second plate may be made of a material having a higher electrical conductivity than that of the first plate.

In an exemplary embodiment, the first plate may be made of nickel, and the second plate may be made of copper.

In an exemplary embodiment, the heat transfer part may be made of a thermal interface material (TIM).

Advantageous Effects

In accordance with the exemplary embodiment, in the cylindrical battery structure, the plurality of plates having different electrical conductivities are constituted to distribute the current when the battery cell is discharged, thereby reducing the amount of heat generated in the plate by virtue of the effect of the improved electrical conductivity.

Also, as the heat transfer material is provided between the battery cell and the plate to transfer the heat generated in the cell to the plate, the heat-radiating effects for decreasing the temperature of the cell is provided.

MODE FOR CARRYING OUT THE INVENTION

Figure 1:
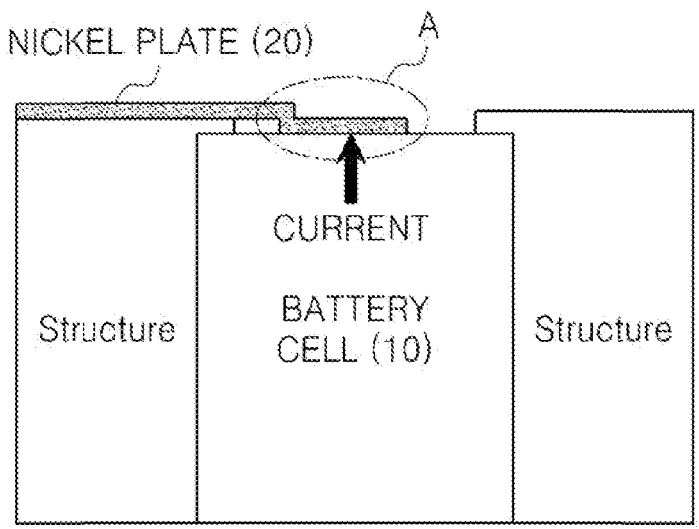
FIG. 1 is a schematic view illustrating an electrically connected structure of a typical battery cell.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein. In the drawings, anything unnecessary for describing the present disclosure will be omitted for clarity, and also like reference numerals in the drawings denote like elements.

It will be understood that although the ordinal numbers such as first and second are used herein to describe various elements, these elements should not be limited by these numbers. The terms are only used to distinguish one component from other components. For example, a first element referred to as a first element in one embodiment can be referred to as a second element in another embodiment. In the following description, the technical terms are used only for explaining a specific exemplary embodiment while not limiting the present disclosure. The terms of a singular form may include plural forms unless referred to the contrary. In this specification below, when one part is referred to as being 'connected' to another part, it should be understood that the former can be 'directly connected' to the latter, or 'electrically connected to the latter via an intervening part. Furthermore, when it is described that one comprises (or includes or has) some elements, it should be understood that it may comprise (or include or has) only those elements, or it may comprise (or include or have) other elements as well as those elements if there is no specific limitation.

The term "process (doing)" or "process of", which is used over the specification, does not represent the term "process for".

Meanwhile, for the terms used in the present disclosure, general terms widely currently used have been selected as possible as they can. In a specific case, terms arbitrarily selected by an applicant may be used. In this case, since the meaning thereof is described in detail in the detailed description of the specification, the present disclosure should be understood in an aspect of meaning of such terms, not the simple names of such terms.

Hereinafter, the present device will be described in detail with reference to the accompanying drawings.

FIG. 1 is a schematic view illustrating a structure in which battery cells are connected when a typical battery pack is manufactured.

Referring to FIG. 1, a method for electrically connecting a plurality of battery cells 10 for manufacturing a typical cylindrical battery pack is performed by resistance-welding an upper partial area A of the battery cell 10 to a nickel plate 20.

In the cylindrical battery pack having the above-described connection structure, the current of the battery cell is controlled to be discharged when the current of the battery cell is equal to or greater than a predetermined reference value. Here, the current of the battery cell is discharged in such a manner that the current of the battery cell 10 flows to the nickel plate 20 through the upper partial area A of the battery cell, in which the battery cell and the nickel plate contact each other. That is, when the battery cell is discharged, the current of the battery cell flows to the nickel plate 20 and then is discharged from the nickel plate 20.

However, since the nickel plate 20 has a limitation in electrical conductivity due to the material characteristics, when the battery cell is discharged with a high current, the current flows to the nickel plate 20, and thus the nickel plate 20 generates a large amount of heat due to the current flown from the battery cell 10. Also, as illustrated in FIG. 1, since the area A through which the current of the battery cell 10 flows to the nickel plate 20 is only a partial area of the battery cell, the current flow has a limitation. Accordingly, when the battery cell is discharged with a high current, the battery cell also generates a large amount of heat due to a current that is not smoothly flown from the battery cell 10 to the nickel plate 20 through the area A. The heat generation of the battery cell and the nickel plate may cause various limitations such as damage on the battery cell.

Accordingly, in accordance with an exemplary embodiment, the heat-radiating structure of the cylindrical battery cell is provided to solve the limitation of heat generation of the battery cell and the nickel plate, which is generated in the typical cylindrical battery structure.

Figure 2:
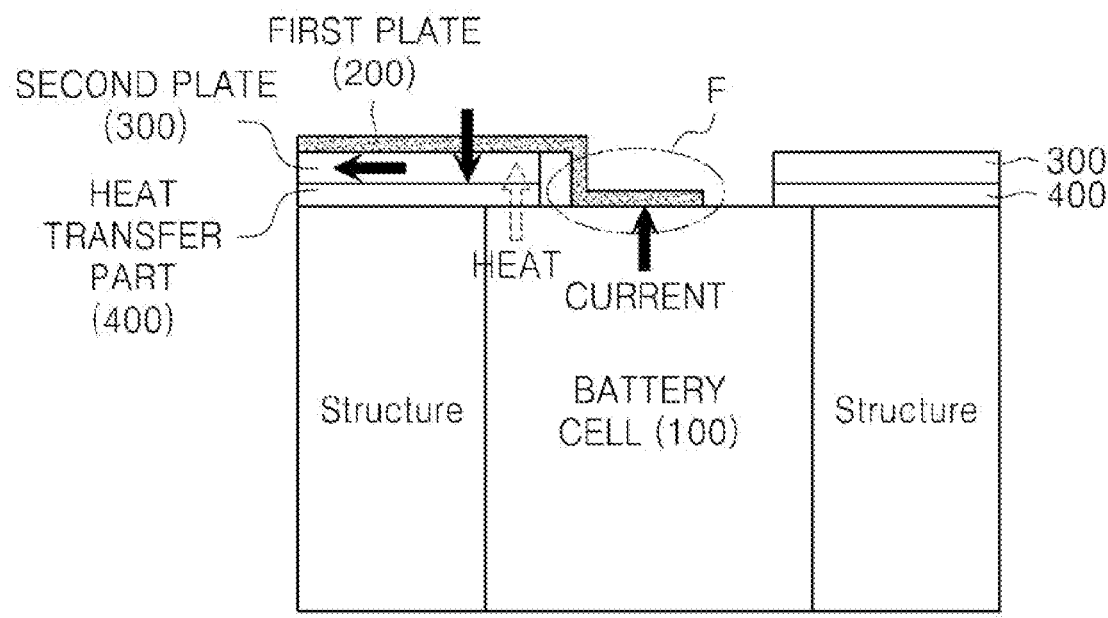
FIG. 2 is a schematic view illustrating a heat-radiating structure of a battery cell in accordance with an exemplary embodiment.

FIG. 2 is a front view illustrating the heat-radiating structure of a battery cell in accordance with an exemplary embodiment.

Referring to FIG. 2, the cylindrical battery may include a battery cell 100, a first plate 200, a second plate 300, and a heat transfer part 400 to design the heat-radiating structure of the cylindrical battery cell.

As illustrated in the drawing, one portion of the first plate 200 is connected to an upper partial area F of the battery cell. Accordingly, when the battery cell is discharged, the current of the battery cell flows to the first plate 200 through the area F in which the battery cell 100 and the first plate 200 contact each other, and the flown current is discharged from the first plate 200.

That is, the area 'F' in which the battery cell 100 and the first plate 200 contact each other is an area through which the current of the battery cell flows to the first plate 200. Accordingly, as the current of the battery cell 100 flows to the first plate 200, the current of the battery cell is discharged from the first plate.

Here, the first plate 200 may have, e.g., a strip shape.

As shown in the drawing, the second plate 300 is disposed between the battery cell 100 and the first plate 200 while not contacting the battery cell. That is, the second plate 300 is disposed between a portion of the first plate and the battery cell instead of being disposed on the flow area F through which the current of the battery cell flows to the first plate 200.

From the second plate 300 that is disposed as described above, the current of the battery cell, which is discharged from the first plate 200, may be additionally discharged.

The structures described in FIGS. 1 and 2 are collectively referred to as the remaining structures except the battery cells in the battery pack.

Figure 3:
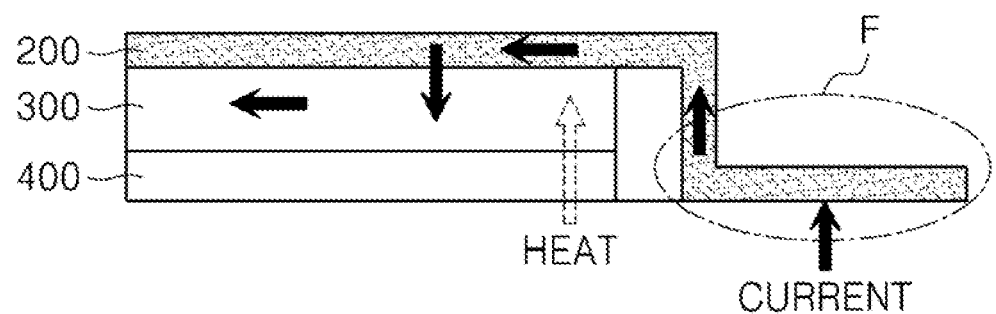
FIG. 3 is an enlarged view illustrating a portion in FIG. 2.

In describing a principle of the heat-radiating structure with reference to FIG. 3, when the battery cell is discharged with a high discharge rate, the current of the battery cell flows to the first plate 200 through the flow area F, and the current of the battery cell, which is flown to the first plate 200, flows to the second plate 300. That is, unlike the typical method in which the current of the battery cell flows to one plate, and the current of the battery cell is discharged from the one plate, an exemplary embodiment provides a structure in which the current of the battery cell is discharged while being distributed to two plates.

Accordingly, when the battery cell is discharged with a high current, the current of the battery cell flows to the first plate 200 and is primarily discharged therefrom, and further flows to the second plate 300 and is secondarily discharged therefrom.

Since the current of the battery cell is discharged from the two plates as described above, the amount of heat generation of the plate may decrease as much as the amount of heat generation caused by being discharged from one plate.

Here, the second plate 300 may include a material having a higher electrical conductivity than that of the first plate 200. For example, the first plate 200 may be made of nickel (Ni), and the second plate 300 may be made of copper (Cu) that is higher in electrical conductivity than nickel.

Meanwhile, the heat transfer part 400 is provided between the second plate 300 and the battery cell 100 and contacts the battery cell to transfer heat generated from the battery cell to the second plate 300.

The heat transfer part 400 may decrease the temperature of the battery cell by transferring the heat generated from the battery cell when the battery cell is discharged to the second plate. Since the second plate 300 is made of a material having a high heat conductivity, e.g., copper (Cu), the heat, which is generated in the battery cell, transferred through the heat transfer part 400 may be further effectively radiated.

Accordingly, in case of the discharge with the high current, when heat is generated in the battery cell due to a current that is not smoothly flown from the battery cell 100 to the first plate 200 through the flow area F, the heat transfer part 400 transfer the corresponding heat to the second plate 300 to be discharged, thereby decreasing the heat generation phenomenon of the battery cell.

Here, the heat transfer part 400 may be made of, e.g., a thermal interface material and include heat-radiating grease, a heat-radiating sheet, a heat-radiating pad, a thermal conductive adhesive, and a phase change material (PCM).

A heat-radiating system of the cylindrical battery cell to which the above-described heat-radiating structure in FIG. 2 is applied will be descried.

The cylindrical battery pack that is designed by applying the heat-radiating structure in accordance with an exemplary embodiment may include a battery cell 100, a first plate 200, a second plate 300, a heat transfer part 400, a current measuring part (not shown), and a control part (not shown).

The current measuring part measures a current of the battery cell.

The control part controls the current of the battery cell 100 to be discharged when the current of the battery cell measured by the current measuring part is equal to or greater than a predetermined value.

The control part serves to prevent the battery cell from being overcharged or overdischarged. That is, the control part may be described as a protection circuit.

When the control part controls the battery cell to be discharged, the current of the battery cell 100 is flown to the first plate 200 through the area F in which the battery cell contacts the first plate 200. Also, the current of the battery cell, which is flown to the first plate 200 and then discharged is flown to the second plate 300. Accordingly, the current discharged from the first plate 200 is additionally discharged from the second plate 300.

That is, when the battery cell is discharged, the current of the battery cell is distributed to and then discharged from the two plates 200 and 300 while being flown from the first plate 200 to the second plate 300.

Here, the second plate 300 may be made of a material having a higher electrical conductivity than that of the first plate 200. For example, the first plate 200 is made of nickel (Ni), and the second plate is made of copper (Cu).

The heat transfer part 400 disposed between the battery cell 100 and the second plate 300 transfers the heat generated from the battery cell to the second plate.

Since the current of the battery cell flows through the partial area F in which the battery cell contacts the first plate 200, when the current is not smoothly flown from the battery cell 100 to the first plate 200 through the flow area F during the battery cell is discharged with the high current, heat may be generated in the battery cell due to the corresponding current. Accordingly, as the heat transfer part 400 is provided between the battery cell 100 and the second plate 300 to transfer the heat generated from the battery cell to the second plate in the above-described case, the temperature of the battery cell may decrease.

Here, since the second plate 300 is made of the material having a high electrical conductivity, e.g., copper (Cu) as described above, the heat of the battery cell, which is transferred from the heat transfer part 400, may be radiated.

Here, the heat transfer part 400 may be made of, e.g., a thermal interface material and include heat-radiating grease, a heat-radiating sheet, a heat-radiating pad, a thermal conductive adhesive, and a phase change material (PCM).

As described above, the technical idea of the present invention has been specifically described with respect to the above embodiments, but it should be noted that the foregoing embodiments are provided only for illustration while not limiting the present invention. Also, it will be understood by those skilled in the art that various embodiments can be made within the scope of the technical idea of the present invention.

The invention claimed is:

1. A heat-radiating structure of a cylindrical battery cell, comprising:
    a first plate configured to contact an upper partial area of a battery cell and to which a current of the battery cell is discharged, the first plate having an area not contacting the battery cell;
    a second plate disposed under the first plate, the second plate not contacting the battery cell; and
    a heat transfer part disposed under the first plate between the second plate and the battery cell and configured to transfer heat generated in the battery cell to the second plate while contacting the battery cell,
    wherein the second plate contacts the area of the first plate not contacting the battery cell and a portion of the current discharged from the battery cell to the first plate is discharged from the second plate, the second plate being between the heat transfer part and the first plate,
    wherein the first plate, the second plate and the heat transfer part are stacked in a first direction,
    wherein a width of the first plate in a second direction orthogonal to the first direction is greater than a width of the second plate in the second direction and a width of the heat transfer part in the second direction,
    wherein the first plate has a first section and a second section, the second section offset from the first section in the first direction, and
    wherein a bottom surface of the second section of the first plate covers an entire top surface of the second plate.

2. The heat-radiating structure of claim 1, wherein the second plate is made of a material having a higher electrical conductivity than that of the first plate.

3. The heat-radiating structure of claim 2, wherein the first plate is made of nickel.

4. The heat-radiating structure of claim 2, wherein the second plate is made of copper.

5. The heat-radiating structure of claim 1, wherein the heat transfer part is made of a thermal interface material (TIM).

6. A heat-radiating system of a cylindrical battery cell, comprising:

a current measurer configured to measure a current of a battery cell;

a control part configured to control the current of the battery cell to be discharged, when the current of the battery cell measured by the current measuring part is equal to or greater than a predetermined value;

a first plate configured to contact an upper partial area of the battery cell and to which the current of the battery cell is discharged according to control of the control part, the first plate having an area not contacting the battery cell;

a second plate disposed between the battery cell and the first plate, the second plate not contacting the battery cell, and the second plate under the first plate so that a portion of the current discharged from the battery cell to the first plate is discharged from the second plate; and a heat transfer part disposed under the second plate and configured to transfer heat generated in the battery cell to the second plate while contacting the battery cell, the second plate being between the heat transfer part and the first plate, wherein the first plate, the second plate and the heat transfer part are stacked in a first direction, wherein a width of the first plate in a second direction orthogonal to the first direction is greater than a width of the second plate in the second direction and a width of the heat transfer part in the second direction, wherein the first plate has a first section and a second section, the second section offset from the first section in the first direction, and wherein a bottom surface of the second section of the first plate covers an entire top surface of the second plate.

7. The heat-radiating system of claim 6, wherein the second plate is made of a material having a higher electrical conductivity than that of the first plate.

8. The heat-radiating system of claim 7, wherein the first plate is made of nickel.

9. The heat-radiating system of claim 7, wherein the second plate is made of copper.

10. The heat-radiating system of claim 6, wherein the heat transfer part is made of a thermal interface material (TIM).

11. The heat-radiating system of claim 6, wherein a bottom surface of the first section of the first plate and a bottom surface of the heat transfer part are coplanar.

12. The heat-radiating system of claim 6, wherein a top surface of the second plate directly contacts a bottom surface of the second section of the first plate, and wherein a bottom surface of the second plate directly contacts a top surface of the heat transfer part.

13. The heat-radiating system of claim 6, wherein the first plate further comprises a vertical section between the first section and the second section.

14. The heat-radiating system of claim 13, wherein the first section and the second section extend in opposite directions from the vertical section.

15. The heat-radiating system of claim 14, wherein the vertical section is perpendicular to the first section and the second section.

16. The heat-radiating system of claim 13, wherein the first section, the second section and the vertical section are integrally formed.

* * * * *